United States Patent
Kim et al.

(10) Patent No.: US 11,506,639 B2
(45) Date of Patent: Nov. 22, 2022

(54) VIRTUAL SENSING APPARATUS OF STRUCTURAL VIBRATION AND OPERATING METHOD THEREOF

(71) Applicant: UNIVERSITY-INDUSTRY COOPERATION GROUP OF KYUNG HEE UNIVERSITY, Yongin-si (KR)

(72) Inventors: Jin Gyun Kim, Suwon-si (KR); Seung In Oh, Bucheon-si (KR); Hyun Woo Baek, Seoul (KR); Seung Hun Kim, Yongin-si (KR); Daeun Park, Uijeongbu-si (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 17/176,571

(22) Filed: Feb. 16, 2021

(65) Prior Publication Data

US 2021/0262990 A1 Aug. 26, 2021

(30) Foreign Application Priority Data

Feb. 17, 2020 (KR) .................... 10-2020-0018826

(51) Int. Cl.
*G01N 29/44* (2006.01)
*G01N 29/04* (2006.01)
(Continued)

(52) U.S. Cl.
CPC ......... *G01N 29/4472* (2013.01); *G01H 13/00* (2013.01); *G01H 17/00* (2013.01);
(Continued)

(58) Field of Classification Search
CPC .......... G01H 1/00; G01H 13/00; G01H 17/00; G06F 30/23; G01N 2291/014; G01N 2291/023; G01N 2291/2697; G01N 29/04; G01N 29/045; G01N 29/14; G01N 29/2418; G01N 29/4472
See application file for complete search history.

(56) References Cited

FOREIGN PATENT DOCUMENTS

KR   10-2002-0072944 A    9/2002
KR      100418024 B1 *  2/2004   ............. G06Q 50/08
(Continued)

OTHER PUBLICATIONS

English machine translation of Yang (KR 100418024 B1) (Year: 2004).*
(Continued)

*Primary Examiner* — Roy Y Yi
*Assistant Examiner* — Geoffrey T Evans
(74) *Attorney, Agent, or Firm* — Sughrue Mion, PLLC

(57) ABSTRACT

The present disclosure relates to a technical virtual sensing idea of indirectly measuring structural vibration information on an unmeasured point while minimizing the number of sensors attached for actual measurement, and more particularly, to a technique of estimating measurement data of an unmeasured point using a finite element model, synchronized and updated based on experimental data of an actual measurement subject structure, and a virtual sensing algorithm.

15 Claims, 13 Drawing Sheets

(51) Int. Cl.
 *G01H 13/00* (2006.01)
 *G01H 17/00* (2006.01)
 *G06F 30/23* (2020.01)
(52) U.S. Cl.
 CPC ....... *G01N 29/04* (2013.01); *G01N 2291/014* (2013.01); *G01N 2291/023* (2013.01); *G06F 30/23* (2020.01)

(56) References Cited

FOREIGN PATENT DOCUMENTS

| KR | 10-1695562 B1 | 1/2017 |
| KR | 10-2006056 B1 | 7/2019 |
| KR | 10-2031843 B1 | 10/2019 |
| KR | 10-2045617 B1 | 11/2019 |

OTHER PUBLICATIONS

Communication dated Jun. 16, 2021 by the Korean Patent Office in Korean Application No. 10-2020-0018826.
Gong et al., "Finite Element Model Updating of Structures Using Deep Neural Network", Journal of the Korean Society of Civil Engineers, 2019, vol. 39, No. 1, pp. 147-154 (9 pages total).

* cited by examiner

[FIG. 1]
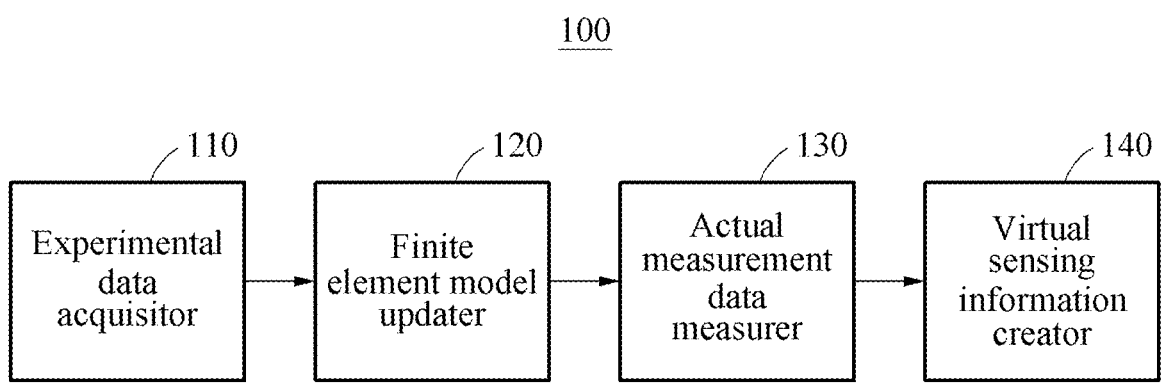

[FIG. 2]
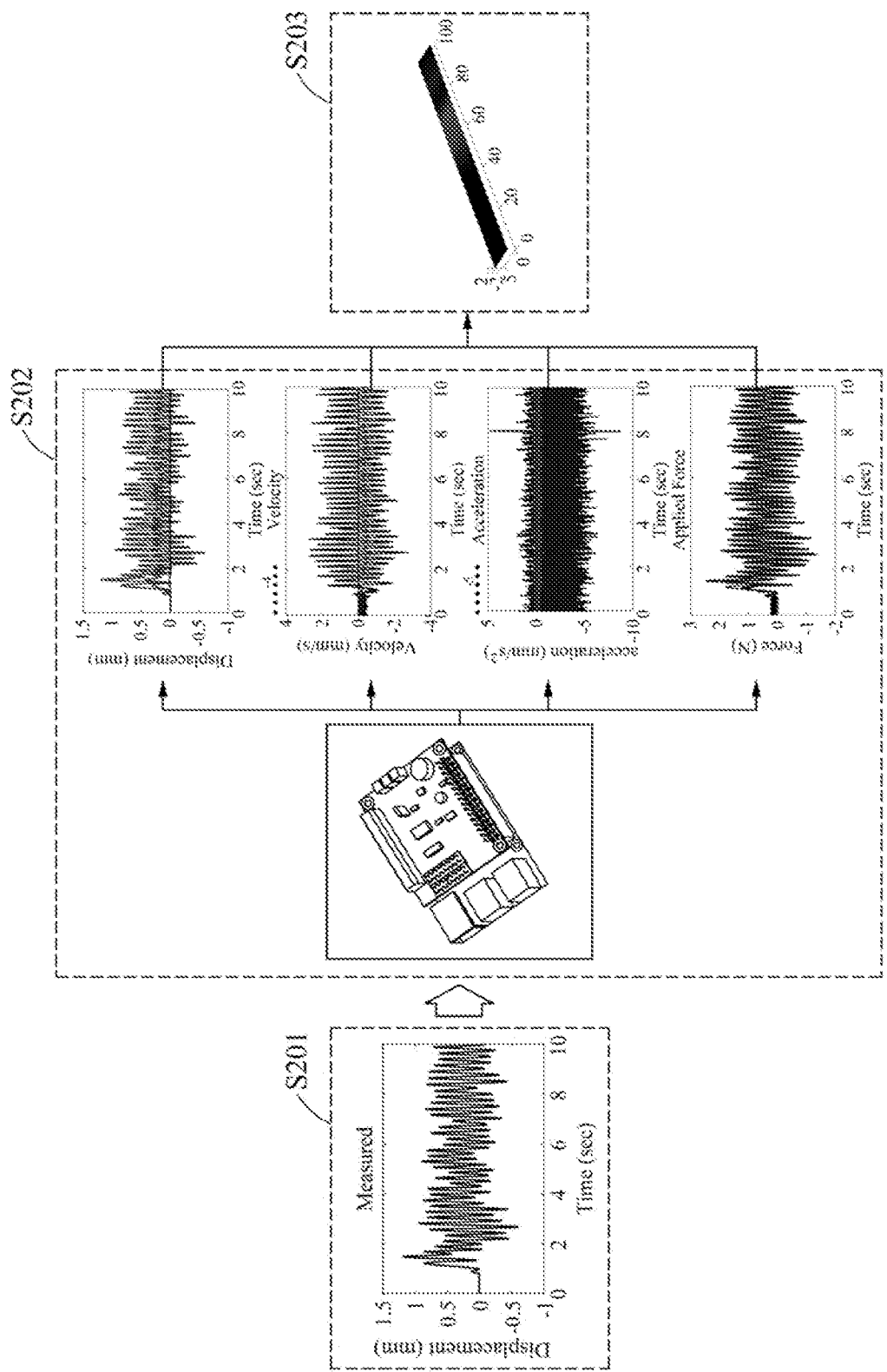

[FIG. 3]
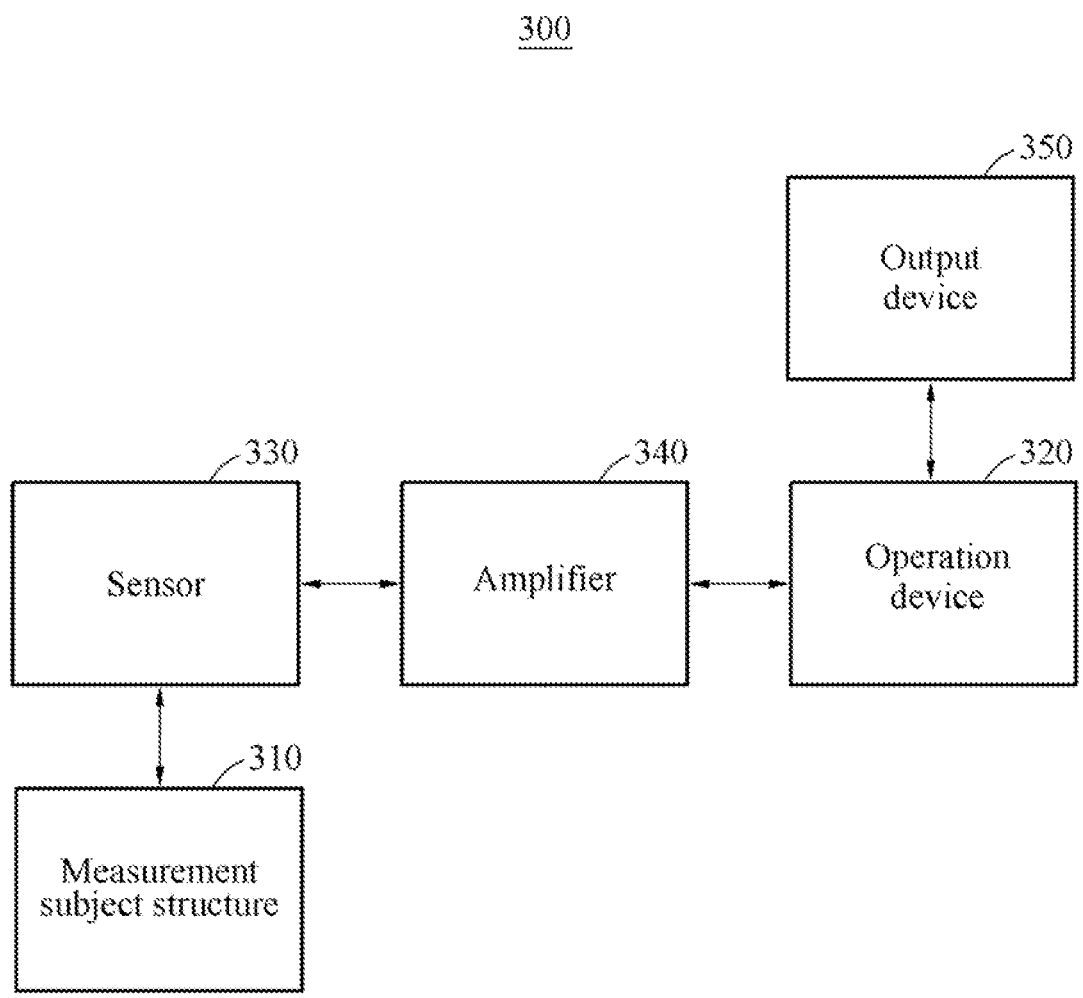

[FIG. 4]
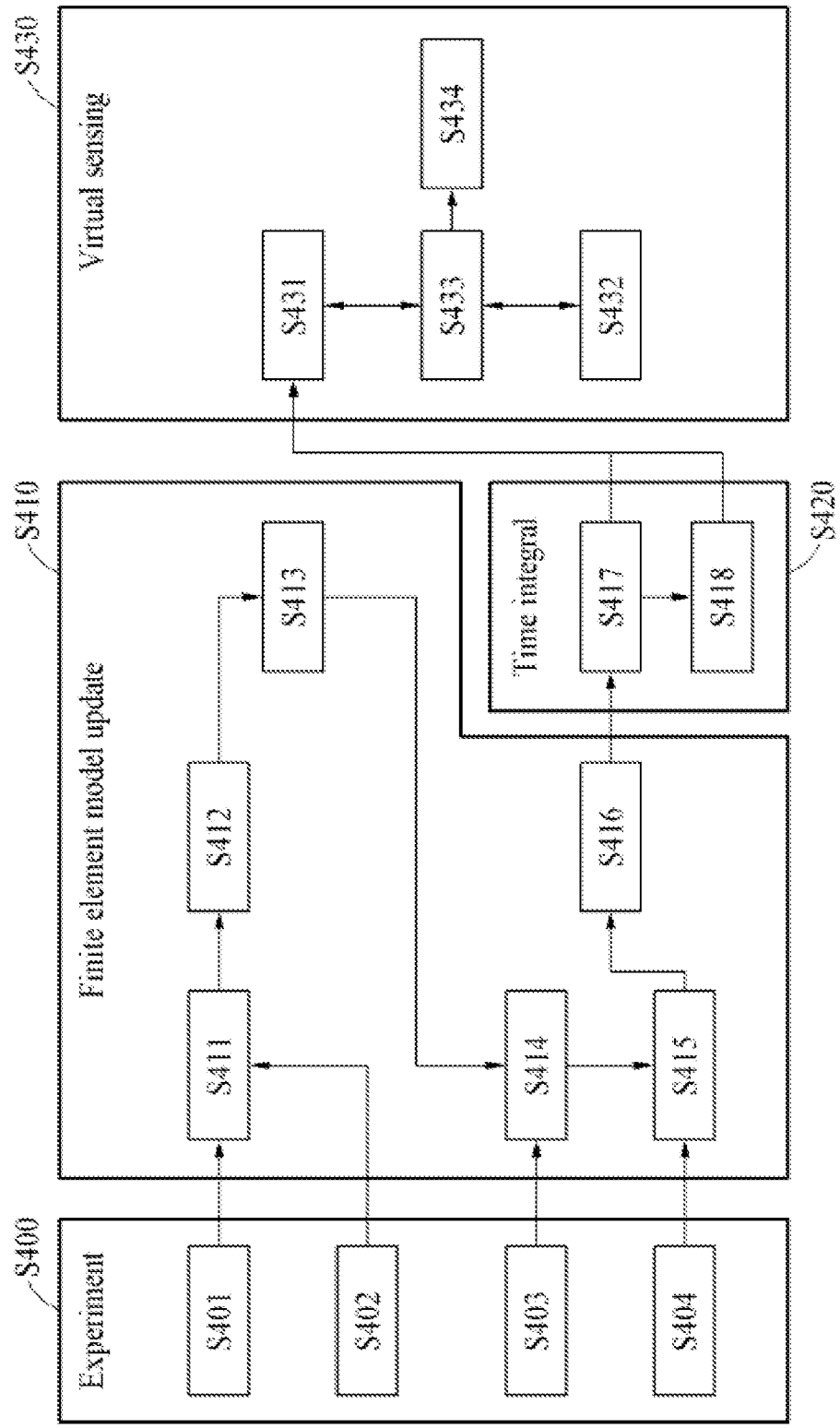

[FIG. 5]
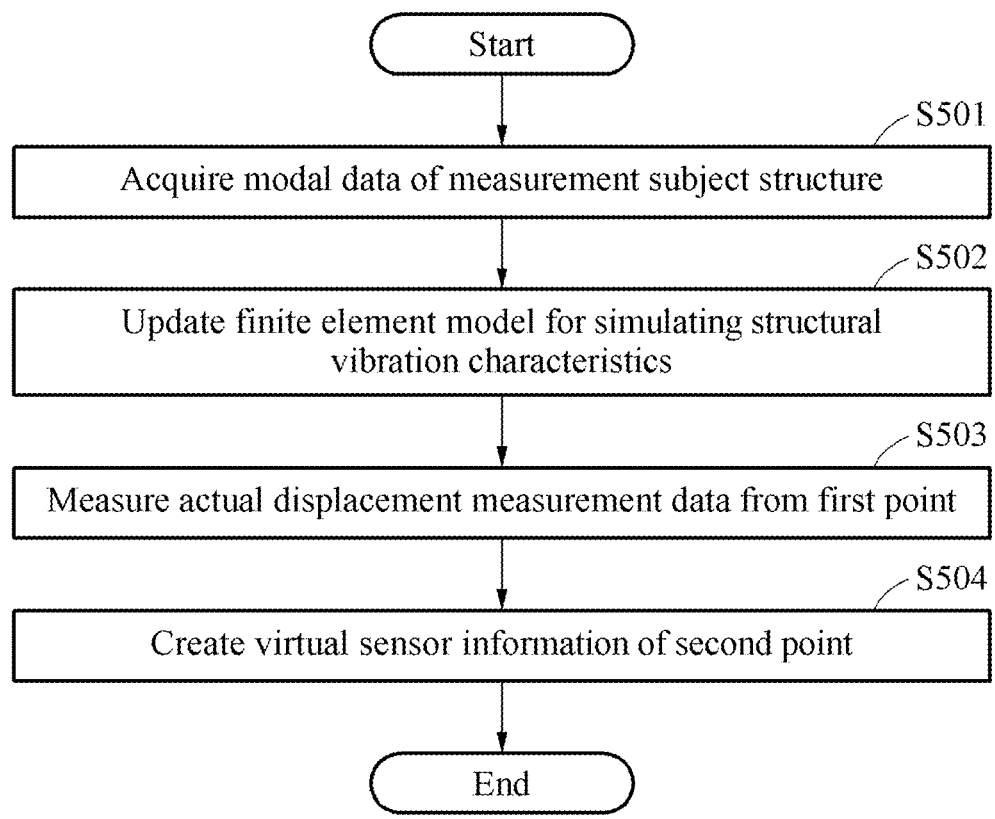

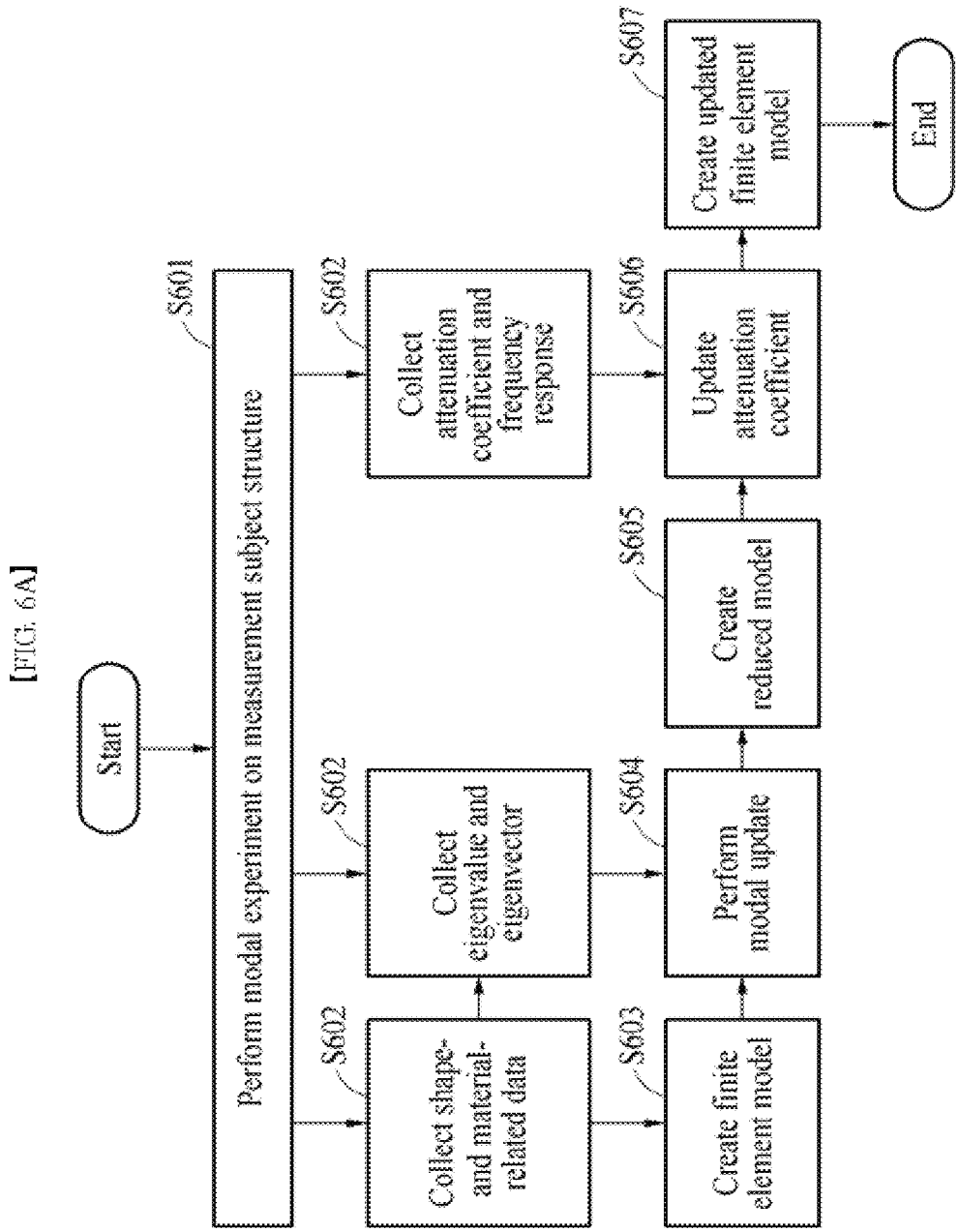
[FIG. 6A]

[FIG. 6B]
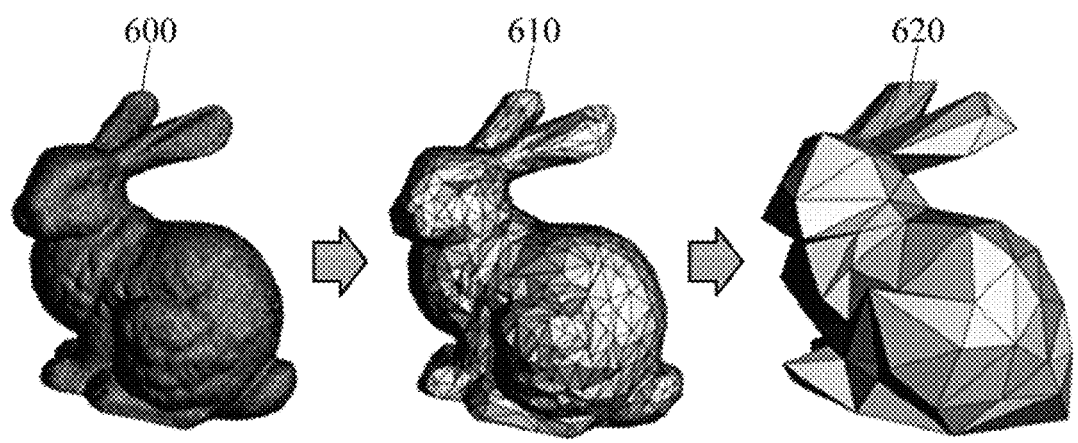

[FIG. 7]
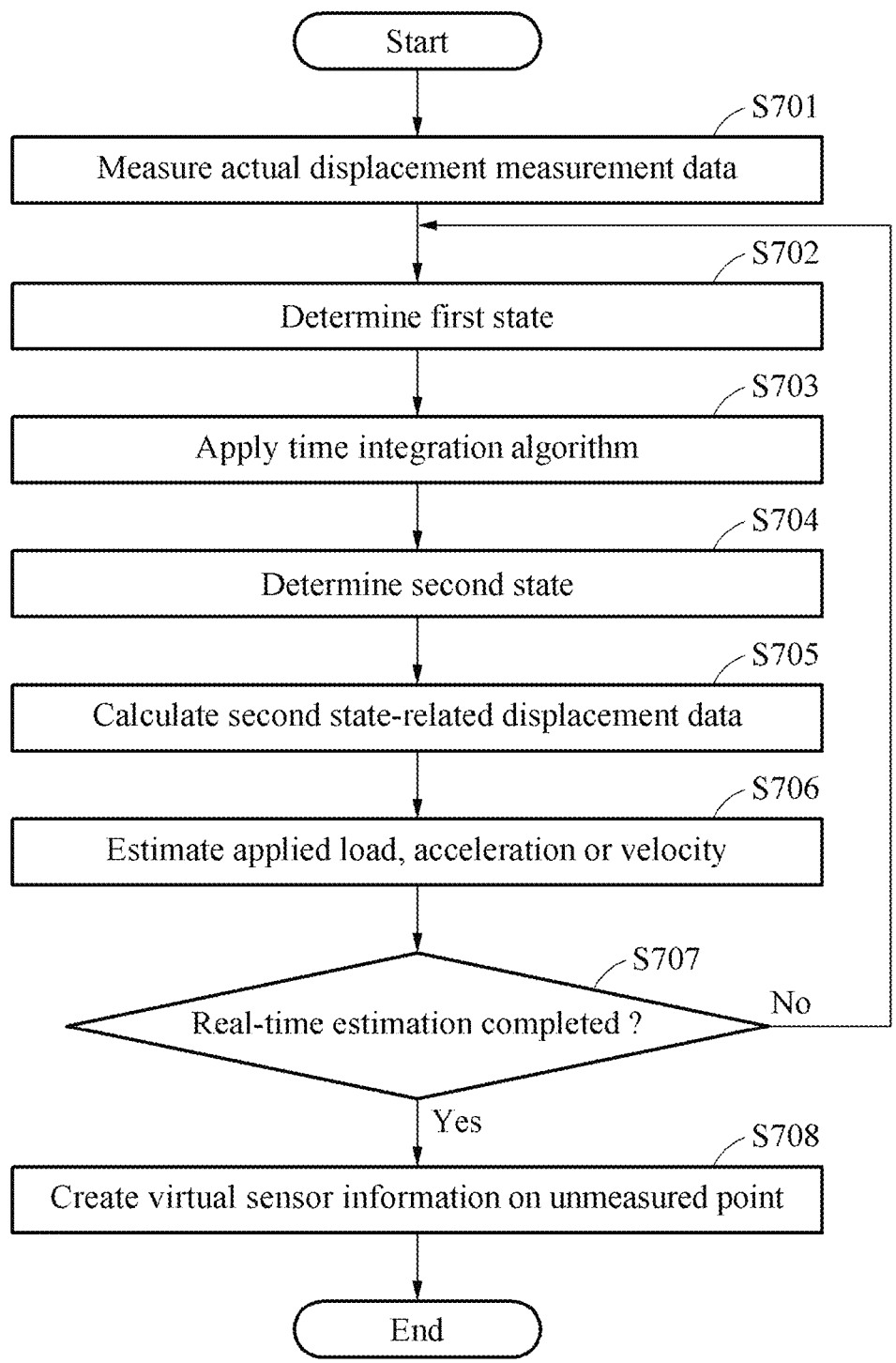

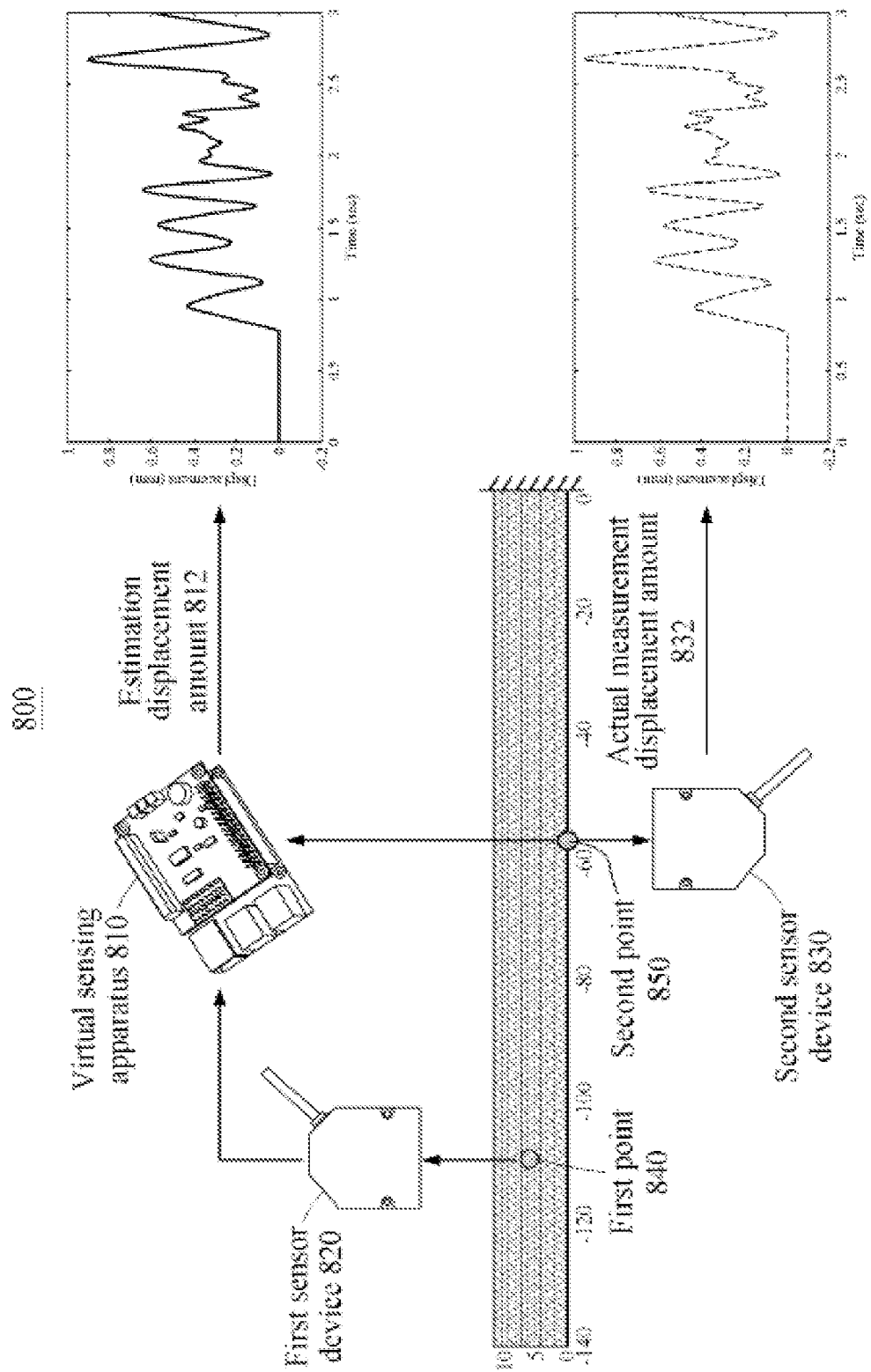
[FIG. 8A]

[FIG. 8B]
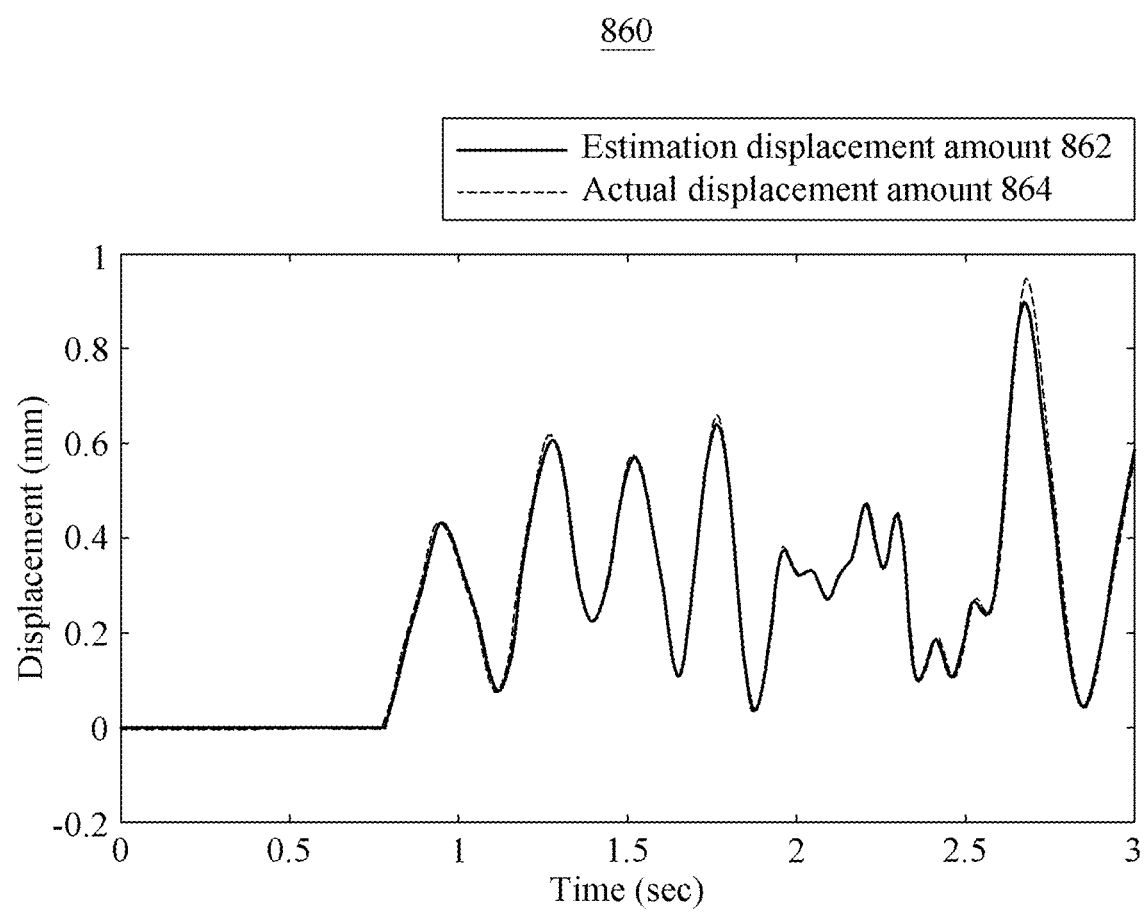

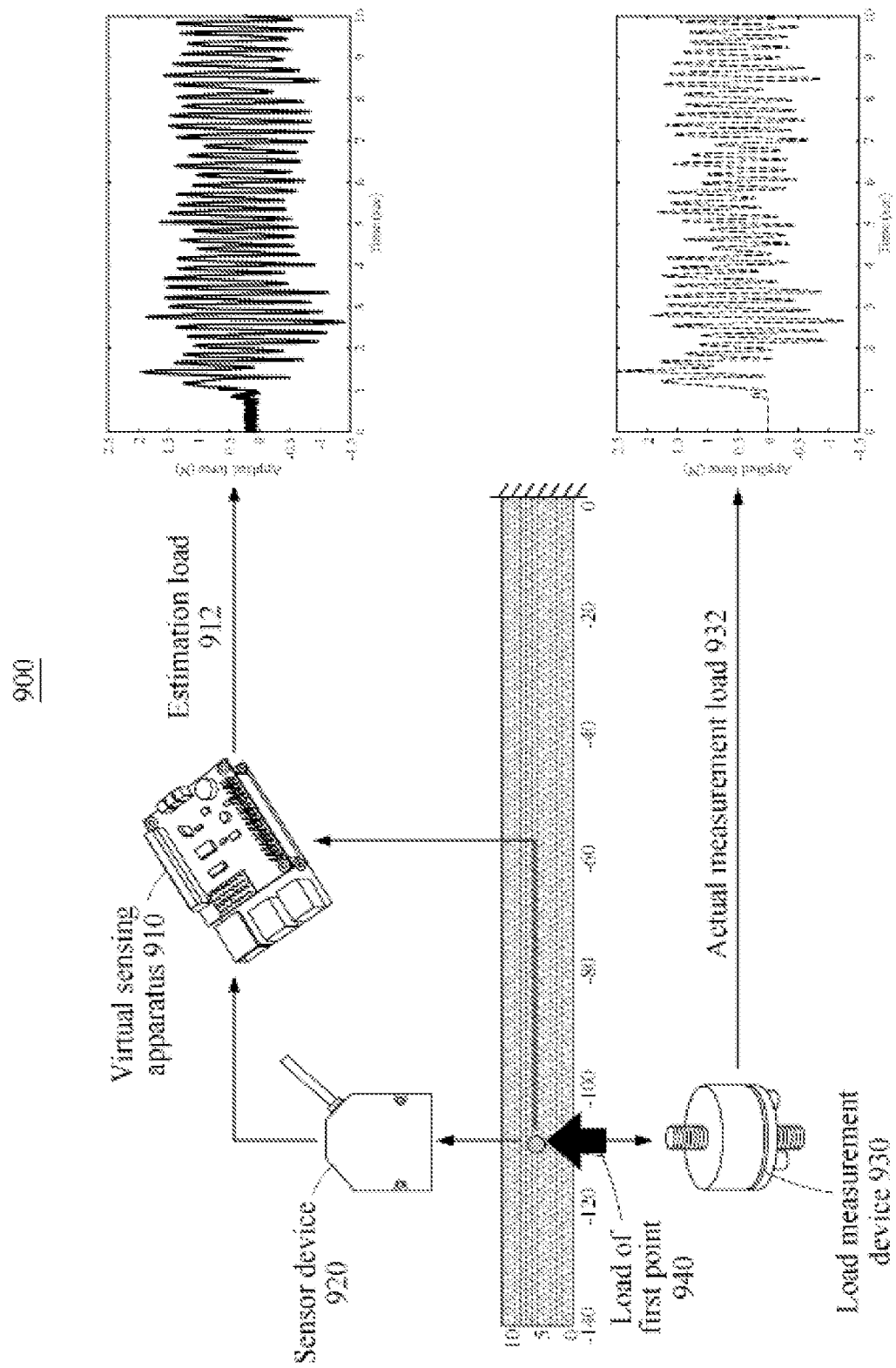
[FIG. 9A]

[FIG. 9B]
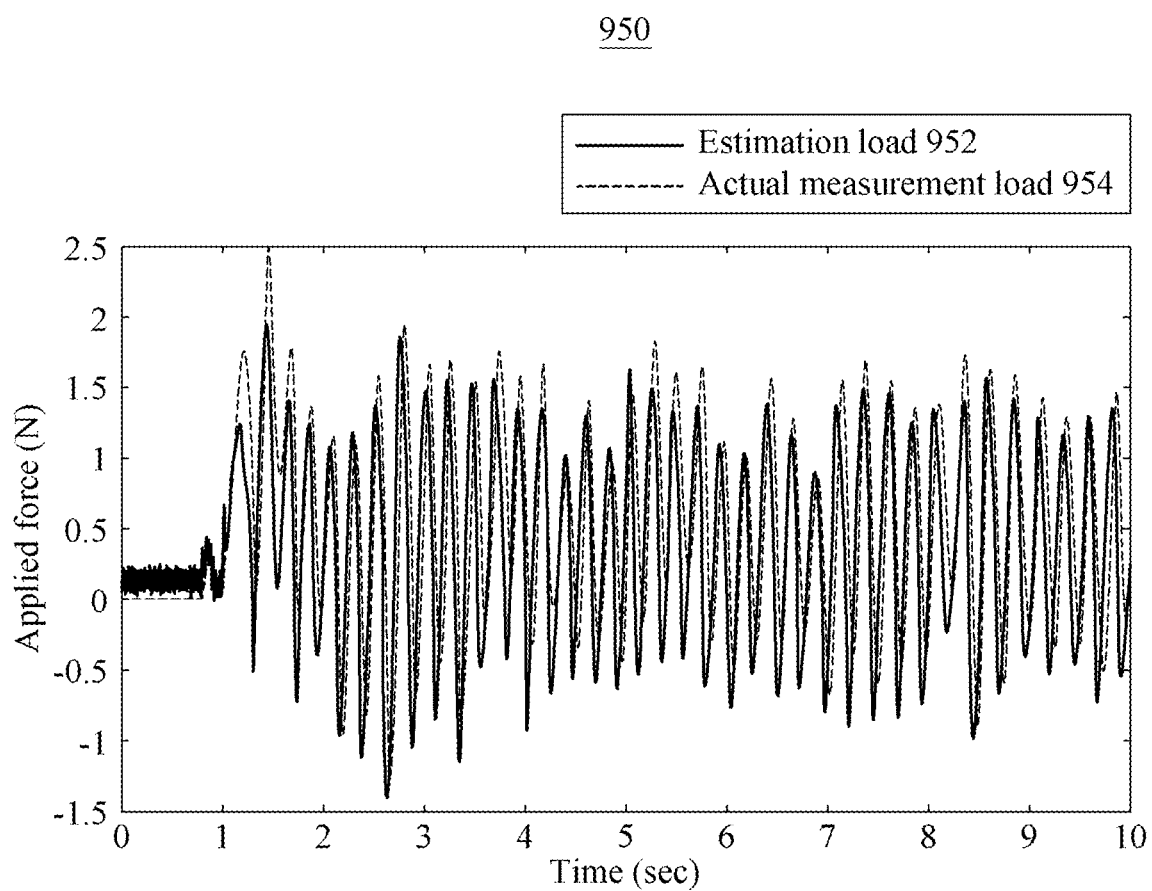

[FIG. 10]
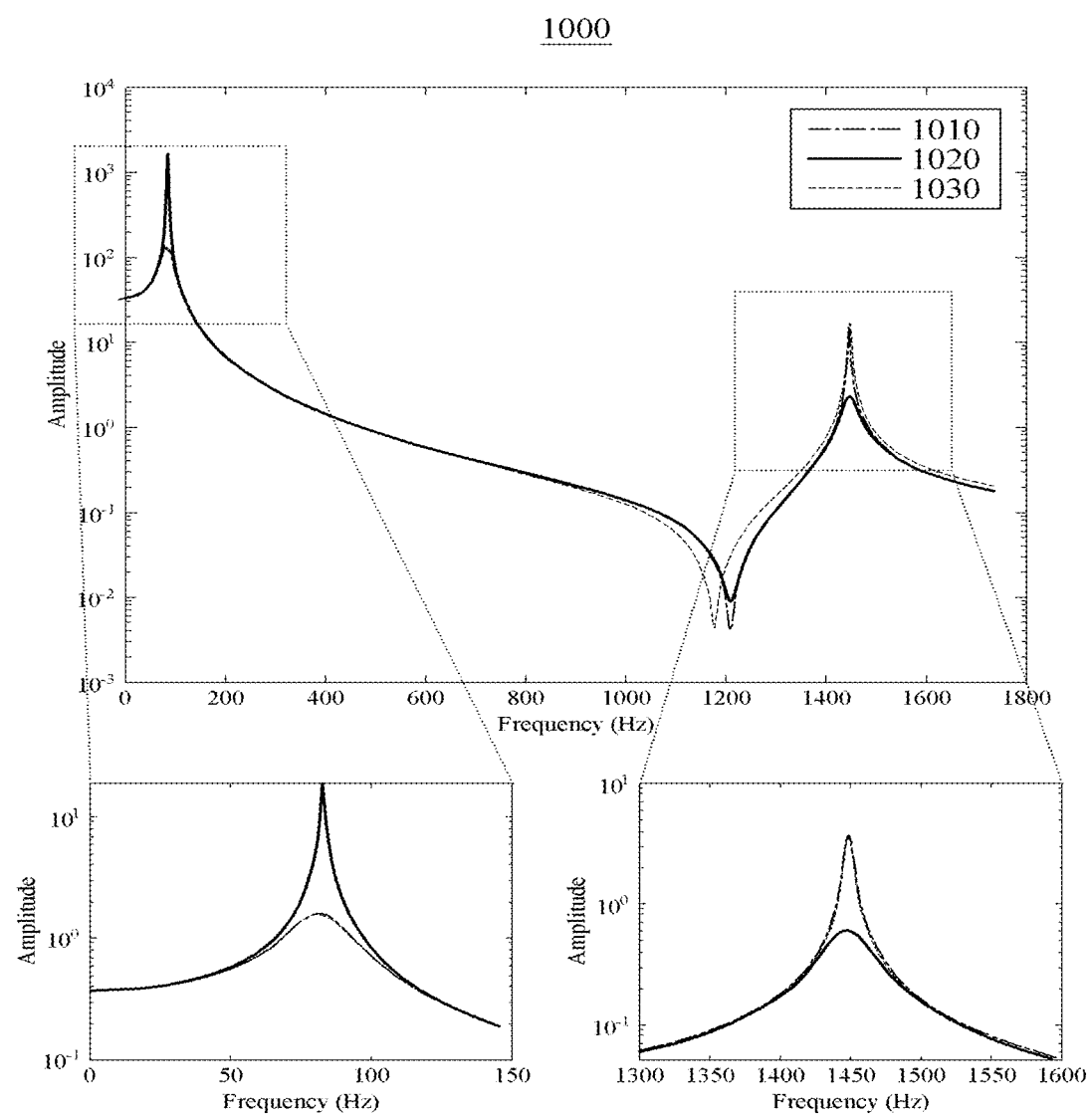

VIRTUAL SENSING APPARATUS OF STRUCTURAL VIBRATION AND OPERATING METHOD THEREOF

CROSS-REFERENCE TO RELATED APPLICATION

This application claims priority to Korean Patent Application No. 10-2020-0018826, filed on Feb. 17, 2020 in the Korean Intellectual Property Office, the disclosure of which is incorporated herein by reference.

BACKGROUND OF THE DISCLOSURE

Field of the Disclosure

The present disclosure relates to a technical virtual sensing idea of indirectly measuring structural vibration information on an unmeasured point while minimizing the number of sensors attached for actual measurement, and more particularly, to a technique of estimating measurement data of an unmeasured point using a finite element model, synchronized and updated based on experimental data of an actual measurement subject structure, and a virtual sensing algorithm.

Description of the Related Art

With the recent rapid development of information and communication technology and the universalization of Internet On Things (IOT) technology, the complexity of mechanical systems is also increasing rapidly. In particular, the demand for Prognostics and Health Monitoring (PHM) technology to preemptively respond by estimating the health of a mechanical system in real time and predicting the lifespan of a structure in advance is gradually increasing.

Meanwhile, the rapid growth of semiconductor technology has resulted in miniaturization of computers and advancement of computational speed. Accordingly, an era in which a high-performance, compact computing system can be configured at very low cost has been realized. This technological background has become a driving force for research and development of digital twin technology, one of the important foundation technologies of the 4th industrial revolution.

To successfully construct a digital twin system, precise sensor technology for converting the state of an actual structure into a physical model is necessary required. However, attachment of a large number of sensors to measure high-quality physical data may affect the physical properties of a structure, and may cause great increase in the manufacturing cost of the system.

In particular, attachment of sensors in a structural vibration system may cause a direct change in mass and stiffness, leading to a decrease in the reliability of measurement data. In addition, the possibility that access and measurement may become impossible depending on the type of data and a measurement location has been pointed out as a limitation of the existing sensing technology.

Meanwhile, to measure the structural vibration characteristics of a structure, a finite element model, which is a kind of physical model, can be used. The finite element model of a general structural vibration system can be expressed as Mathematical Equation 1 below:

$$M\ddot{u} + C\dot{u} + Ku = f \quad \text{[Mathematical Equation 1]}$$

In Mathematical Equation 1, M can represent mass, C can represent damping, K can represent a stiffness matrix, u can represent displacement, and f can represent external force.

A finite element model constructed in a general method is based on target properties and shapes used in the design of a structure. Accordingly, due to manufacturing tolerances and uncertainties of used materials, some differences from an actual measurement target structure may be exhibited, and correction techniques are required to secure the reliability of a numerical model based on a finite element model.

RELATED ART DOCUMENTS

Patent Documents

Korean Patent No. 10-2031843, "METHOD AND APPARATUS FOR GENERATING VIRTUAL SENSOR DATA"

Korean Patent No. 10-1695562, "UPDATING OF FINITE ELEMENT MODEL AND REALITME STRUCTURAL HEALTH ANALYSIS USING THE SENSOR DATA"

Korean Patent No. 10-2045617, "MONITORING APPARATUS AND METHOD FOR ABNORMAL OF EQUIPMENTS"

Korean Patent No. 10-2006056, "LOCATION-BASED VIRTUAL SENSOR CREATION AND SENSOR INFORMATION DELIVERY METHOD"

SUMMARY OF THE DISCLOSURE

Therefore, the present disclosure has been made in view of the above problems, and it is an object of the present disclosure to reprocess data measured at a specific point of an actual measurement subject structure using a finite element model synchronized and updated based on experimental data of the actual measurement subject structure and a virtual sensing algorithm to estimate measurement data of an unmeasured point.

It is another object of the present disclosure to minimize the number of sensors attached for actual measurement, thereby preventing change in structural properties due to the attached sensors and minimizing installation cost due to sensor attachment.

It is still another object of the present disclosure to predict an unmeasured point or unmeasured vibration information based on minimal measurement information.

It is still another object of the present disclosure to design a physical model based on experimental data of an actual measurement subject structure such that a finite element model and the actual measurement subject structure have the same structural vibration characteristics.

It is yet another object of the present disclosure to reduce the amount of computation required upon application of a time integration algorithm using data measured at a specific point of an actual measurement subject structure through application of a finite element reduction modeling technique, and a finite element model.

In accordance with an aspect of the present disclosure, the above and other objects can be accomplished by the provision of a virtual sensing apparatus of structural vibration, including: an experimental data acquisitor configured to perform a modal experiment on a measurement subject structure to acquire modal data; a finite element model updater configured to update a finite element model for simulating structural vibration characteristics of the measurement subject structure using the acquired modal data and a reduced modeling technique; an actual measurement data measurer configured to measure actual displacement measurement data from a first point of the measurement subject structure; and a virtual sensing information creator configured to estimate virtual displacement data at a second point of the measurement subject structure using the updated finite element model, the measured actual displacement measurement data and a time integration algorithm and create virtual sensor information of the second point based on the estimated virtual displacement data.

The experimental data acquisitor may acquire the modal data including at least one of a natural frequency, an eigenvector, a damping coefficient and a frequency response, based on the performed modal experiment.

The finite element model updater may collect data related to mass, damping coefficient, stiffness matrix, displacement, shape and constituent materials of the measurement subject structure and may construct the finite element model based on the collected data.

The finite element model updater may primarily update the constructed finite element model using the natural frequency and the eigenvector, may create a reduced model for the primarily updated finite element model using the reduced modeling technique, and may secondarily update the reduced model using the damping coefficient and the frequency response to create the updated finite element model.

To minimize differences between the natural frequency and eigenvector of the finite element model and the natural frequency and eigenvector based on the performed modal experiment using the natural frequency and the eigenvector, the finite element model updater may adopt a Modal Assurance Criterion (MAC) value to quantify the differences.

The finite element model updater may consider internal DOFs (Degrees Of Freedom), boundary DOFs and coupling DOFs of the primarily updated finite element model using the reduced modeling technique, and may divide the considered internal DOFs into substrates to create the reduced model.

The finite element model updater may apply the damping coefficient to the created reduced model to calculate a Frequency Response Function (FRF), and may quantify similarity by comparing the frequency response with the frequency response based on the calculated FRF, thereby secondarily updating the reduced model to create the updated finite element model.

The finite element model updater may compare the frequency response with the calculated FRF-based frequency response using a Frequency Response Assurance Criterion (FRAC) value.

The virtual sensing information creator may reflect the measured actual displacement measurement data in the updated finite element model, and then set the measured actual displacement measurement data, as an initial value, based on the time integration algorithm to calculate a finite element model calculation value of the updated finite element model, and may calculate change in any one of stiffness, load, displacement, velocity and acceleration, which are virtual displacement data at the second point, using the calculated finite element model calculation value.

The virtual sensing information creator may use a Newmark-β time integration technique as the time integration algorithm, and may calculate change in the load, the displacement, the velocity or the acceleration through iterative calculation after calculating change in the stiffness through initial calculation.

The first point may be a point which is located at the measurement subject structure and to which the actual measurement data measurer is attached, and the second point may be a point which is located at the measurement subject structure and from which the actual displacement measurement data is not measured.

In accordance with another aspect of the present disclosure, there is provided an operation method of a virtual sensing apparatus of structural vibration, the operation method including: performing, by an experimental data acquisitor, a modal experiment on a measurement subject structure to acquire modal data; updating, by a finite element model updater, a finite element model for simulating structural vibration characteristics of the measurement subject structure using the acquired modal data and a reduced modeling technique; measuring, by an actual measurement data measurer, actual displacement measurement data from a first point of the measurement subject structure; and estimating, by a virtual sensing information creator, virtual displacement data at a second point of the measurement subject structure using the updated finite element model, the measured actual displacement measurement data and a time integration algorithm and creating virtual sensor information of the second point based on the estimated virtual displacement data.

The performing may include acquiring the modal data including at least one of a natural frequency, an eigenvector, a damping coefficient and a frequency response, based on the performed modal experiment.

The operation method may further include, by the finite element model updater, collecting data related to mass, damping coefficient, stiffness matrix, displacement, shape and constituent materials of the measurement subject structure and constructing the finite element model based on the collected data.

The primarily updating may include introducing a Modal Assurance Criterion (MAC) value to minimize differences between the natural frequency and eigenvector of the finite element model and the natural frequency and eigenvector based on the performed modal experiment using the natural frequency and the eigenvector, thereby quantifying the differences, the creating may include considering internal DOFs (Degrees Of Freedom), boundary DOFs and coupling DOFs of the primarily updated finite element model using the reduced modeling technique, and dividing the considered internal DOFs into substrates to create the reduced model, and the secondarily updating may include applying the damping coefficient to the created reduced model to calculate a Frequency Response Function (FRF); and quantifying similarity by comparing the frequency response with the frequency response based on the calculated FRF, thereby secondarily updating the reduced model to create the updated finite element model.

The estimating and the creating may include: reflecting the measured actual displacement measurement data in the updated finite element model, and then setting the measured actual displacement measurement data, as an initial value, based on the time integration algorithm to calculate a finite element model calculation value of the updated finite element model; and calculating change in any one of stiffness, load, displacement, velocity and acceleration that are virtual displacement data at the second point using the calculated finite element model calculation value.

BRIEF DESCRIPTION OF THE DRAWINGS

The above and other objects, features and other advantages of the present disclosure will be more clearly understood from the following detailed description taken in conjunction with the accompanying drawings, in which:

FIG. 1 illustrates a virtual sensing apparatus of structural vibration according to an embodiment of the present disclosure;

FIG. 2 illustrates a procedure of constructing or updating a finite element model using actual measurement data by a virtual sensing apparatus of structural vibration according to an embodiment of the present disclosure;

FIG. 3 illustrates an experiment environment of a virtual sensing apparatus of structural vibration according to an embodiment of the present disclosure;

FIG. 4 separately illustrates an experiment step, a finite element model update step, a time integration step and a virtual sensing step by a virtual sensing apparatus of structural vibration according to an embodiment of the present disclosure;

FIG. 5 illustrates an operation method of a virtual sensing apparatus of structural vibration according to an embodiment of the present disclosure;

FIG. 6A illustrates a procedure of updating a finite element model by an operation method of a virtual sensing apparatus of structural vibration according to an embodiment of the present disclosure;

FIG. 6B illustrates creation of a reduced model in update of a finite element model according to an embodiment of the present disclosure;

FIG. 7 illustrates a procedure of creating virtual sensor information of an unmeasured point by an operation method of a virtual sensing apparatus of structural vibration according to an embodiment of the present disclosure;

FIGS. 8A and 8B illustrate an experiment for checking the accuracy of a displacement amount estimated by a virtual sensing apparatus of structural vibration according to an embodiment of the present disclosure;

FIGS. 9A and 9B illustrate an experiment for checking the accuracy of a load estimated by a virtual sensing apparatus of structural vibration according to an embodiment of the present disclosure; and FIG. 10 illustrates a comparison result of frequency responses according to update of a damping coefficient by a virtual sensing apparatus of structural vibration according to an embodiment of the present disclosure.

DETAILED DESCRIPTION OF THE DISCLOSURE

Specific structural and functional descriptions of embodiments according to the concept of the present disclosure disclosed herein are merely illustrative for the purpose of explaining the embodiments according to the concept of the present disclosure. Furthermore, the embodiments according to the concept of the present disclosure can be implemented in various forms and the present disclosure is not limited to the embodiments described herein.

The embodiments according to the concept of the present disclosure may be implemented in various forms as various modifications may be made. The embodiments will be described in detail herein with reference to the drawings. However, it should be understood that the present disclosure is not limited to the embodiments according to the concept of the present disclosure, but includes changes, equivalents, or alternatives falling within the spirit and scope of the present disclosure.

The terms such as "first" and "second" are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the scope of rights according to the concept of the present disclosure.

It will be understood that when an element is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Other words used to describe the relationship between elements should be interpreted in a like fashion (e.g., "between," versus "directly between," "adjacent," versus "directly adjacent," etc.).

The terms used in the present specification are used to explain a specific exemplary embodiment and not to limit the present inventive concept. Thus, the expression of singularity in the present specification includes the expression of plurality unless clearly specified otherwise in context. Also, terms such as "include" or "comprise" in the specification should be construed as denoting that a certain characteristic, number, step, operation, constituent element, component or a combination thereof exists and not as excluding the existence of or a possibility of an addition of one or more other characteristics, numbers, steps, operations, constituent elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure will now be described more fully with reference to the accompanying drawings, in which exemplary embodiments of the disclosure are shown. This disclosure may, however, be embodied in many different forms and should not be construed as limited to the exemplary embodiments set forth herein. Like reference numerals in the drawings denote like elements.

FIG. 1 illustrates a virtual sensing apparatus of structural vibration according to an embodiment of the present disclosure.

Particularly, FIG. 1 illustrates components of the virtual sensing apparatus of structural vibration according to an embodiment of the present disclosure.

Referring to FIG. 1, a virtual sensing apparatus 100 of structural vibration according to an embodiment of the present disclosure includes an experimental data acquisitor 110, a finite element model updater 120, an actual measurement data measurer 130 and a virtual sensing information creator 140.

The experimental data acquisitor 110 according to an embodiment of the present disclosure may perform a modal experiment on a measurement subject structure to acquire modal data.

For example, the measurement subject structure includes an actual measurement subject structure to which external force or load is applied, as a structure of structural vibration.

For example, the experimental data acquisitor 110 may acquire modal data including at least one of a natural frequency, an eigenvector, a damping coefficient and a frequency response, based on the modal experiment.

For example, the modal experiment includes an experiment of applying external force or load to a measurement subject structure using a hammer or the like, and measuring at least one of the natural frequency, eigenvector, damping coefficient and frequency response of the measurement subject structure.

In accordance with an embodiment of the present disclosure, the finite element model updater 120 may update a finite element model for simulating the structural vibration characteristics of a measurement subject structure using modal data and a reduced modeling technique.

For example, the finite element model updater 120 may collect data related to the mass, damping coefficient, stiffness matrix, displacement, shape and constituent materials of the measurement subject structure and may construct the finite element model based on the collected data.

In accordance with an embodiment of the present disclosure, the finite element model updater 120 may primarily update the finite element model, which corresponds to a numerical analysis model, using the modal experiment-based natural frequency and the eigenvector.

In addition, the finite element model updater 120 may create a reduced model for the primarily updated finite element model using the reduced modeling technique, and may secondarily update the reduced model using the modal experiment-based damping coefficient and the frequency response to finally update the finite element model.

For example, to minimize differences between the natural frequency and eigenvector of the finite element model and the natural frequency and eigenvector based on the modal experiment using the modal experiment-based natural frequency and the eigenvector, the finite element model updater 120 may adopt a Modal Assurance Criterion (MAC) value to quantify differences between the natural frequencies and the eigenvectors.

In accordance with an embodiment of the present disclosure, the finite element model updater 120 may consider the internal DOFs (Degrees Of Freedom), boundary DOFs and coupling DOFs of the primarily updated finite element model using the reduced modeling technique, and may divide the considered internal DOFs into substrates to create the reduced model.

For example, in the case of the finite element model, physical DOFs are preserved and, accordingly, can be directly compared with actually measured data. In addition, the finite element model is composed of internal DOFs, boundary DOFs and coupling DOFs. Among the total DOFs, DOFs where the physical quantity is preserved can be divided into boundary DOFs, and the other DOFs can be divided into internal DOFs.

In accordance with an embodiment of the present disclosure, the finite element model updater 120 may apply the modal experiment-based damping coefficient to the created reduced model to calculate a Frequency Response Function (FRF).

In addition, the finite element model updater 120 may quantify similarity by comparing a frequency response of the finite element model with the frequency response based on the FRF, thereby secondarily updating the reduced model to finally update the finite element model.

For example, the finite element model updater 120 may finally complete updating of the finite element model to create a final finite element model.

For example, the finite element model updater 120 may compare the frequency response of the finite element model with the FRF-based frequency response using a Frequency Response Assurance Criterion (FRAC) value.

In accordance with an embodiment of the present disclosure, the actual measurement data measurer 130 may measure actual displacement measurement data from a first point of the measurement subject structure.

For example, the actual measurement data measurer 130 may include a sensor device which is attached to the measurement subject structure and serves to measure actual displacement measurement data for the first point of the measurement subject structure.

For example, the first point may include a point which is located on the measurement subject structure and to which the actual measurement data measurer 130 is attached.

In accordance with an embodiment of the present disclosure, the virtual sensing information creator 140 may estimate virtual displacement data at a second point of the measurement subject structure using the updated finite element model, the actual displacement measurement data and a time integration algorithm and may create virtual sensor information of the second point based on the estimated virtual displacement data.

For example, the virtual sensing information creator 140 may reflect the actual displacement measurement data in the updated finite element model, and then may set the measured actual displacement measurement data, as an initial value, based on the time integration algorithm to calculate a finite element model calculation value of the updated finite element model.

In addition, the virtual sensing information creator 140 may calculate change in any one of stiffness, load, displacement, velocity and acceleration, which are virtual displacement data at the second point, using the calculated finite element model calculation value to create virtual sensor information of the second point.

For example, the second point may be a point which is located on the measurement subject structure, and actual displacement measurement data of which is not measured because the actual measurement data measurer 130 is not attached thereto. In addition, a plurality of second points may be present on the measurement subject structure.

In accordance with an embodiment of the present disclosure, the virtual sensing information creator 140 may use the Newmark-$\beta$ time integration technique as the time integration algorithm, and may calculate change in the load, the displacement, the velocity or the acceleration through iterative calculation after calculating change in the stiffness through initial calculation.

Accordingly, the present disclosure may reprocess data measured at a specific point of the actual measurement subject structure using the finite element model, which is synchronized and updated based on the experimental data of the actual measurement subject structure, and the virtual sensing algorithm to estimate measurement data of an unmeasured point.

In addition, the present disclosure may minimize the number of sensors attached for actual measurement, thereby preventing property change in a structure due to the sensors attached thereto for measurement and minimizing installation cost due to sensor attachment.

FIG. 2 illustrates a procedure of constructing or updating a finite element model using actual measurement data by a virtual sensing apparatus of structural vibration according to an embodiment of the present disclosure.

Referring to FIG. 2, in step S201, the virtual sensing apparatus of structural vibration acquires measurement data through a sensor device attached to an actual measurement subject structure. For example, the measurement data acquired through the sensor device may be experimental data or modal experiment-based modal data for construction of the finite element model.

In step S202, the virtual sensing apparatus of structural vibration may estimate the deformation information, velocity information, acceleration information and external force information of the actual measurement subject structure through the experimental data of step S201 to construct a finite element model or update a previously constructed finite element model.

In step S203, the virtual sensing apparatus of structural vibration may construct or update the finite element model using the experimental data to confirm the data size of the finite element model.

FIG. 3 illustrates an experiment environment of a virtual sensing apparatus of structural vibration according to an embodiment of the present disclosure.

Referring to FIG. 3, an experiment environment 300 of the virtual sensing apparatus of structural vibration according to an embodiment of the present disclosure includes a measurement subject structure 310, an operation device 320, a sensor 330, an amplifier 340 and an output device 350.

For example, the operation device 320 may include the experimental data acquisitor, finite element model updater and virtual sensing information creator which have been described above with reference to FIG. 1.

In accordance with an embodiment of the present disclosure, the sensor 330 may output a laser to a specific point of the measurement subject structure 310 and receive a reflected laser so as to collect actual displacement measurement data of the measurement subject structure 310 based on the received laser.

For example, the sensor 330 may include the actual measurement data measurer described above with reference to FIG. 1.

In accordance with an embodiment of the present disclosure, the amplifier 340 may amplify signals of the actual displacement measurement data measured by the sensor 330 to transmit the amplified signals to the operation device 320.

For example, in the operation device 320, the inputted displacement signals may be utilized for response estimation of an unmeasured point by a real-time response estimation algorithm in the operation device 320.

For example, the operation device 320 may include a data storage device for storing virtual sensor information on the estimated unmeasured point.

In accordance with an embodiment of the present disclosure, the output device 350 may perform control such that the virtual sensor information on the unmeasured point estimated by the operation device 320 is outputted to frequency data.

Here, the frequency data outputted on the output device 350 may be related to data shown in FIGS. 8B, 9B and 10.

FIG. 4 separately illustrates an experiment step, a finite element model update step, a time integration step and a virtual sensing step by a virtual sensing apparatus of structural vibration according to an embodiment of the present disclosure.

Referring to FIG. 4, the virtual sensing apparatus of structural vibration according to an embodiment of the present disclosure may acquire a natural frequency of a measurement subject structure in step S401 among an experiment step (S400), may acquire an eigenvector of the measurement subject structure in step S402 thereamong, may acquire a damping coefficient of the measurement subject structure in step S403 thereamong, and may acquire a frequency response of the measurement subject structure in step S404 thereamong.

In addition, the virtual sensing apparatus of structural vibration may primarily update a finite element model using the natural frequency and the eigenvector in step S411 among a finite element model update step (S410), may create the primarily updated finite element model in step S412 thereamong, may create a reduced model using a reduced modeling technique in step S413 thereamong, may renew a damping coefficient of the reduced model using a damping coefficient in step S414 thereamong, may renew a frequency response of the reduced model using the frequency response in step S415 thereamong to secondarily update the finite element model, and may create a secondarily renewed final finite element model in step S416 thereamong.

In addition, the virtual sensing apparatus of structural vibration may apply a time integration technique to the final finite element model in step S421 among a time integration step (S420), and may estimate a load in the finite element model in step S422 thereamong.

In addition, the virtual sensing apparatus of structural vibration may create a physical model, to which the estimated load is applied, in step S431 among a virtual sensing step (S430), may receive actually measured data of a specific point of the measurement subject structure from a sensor device attached to a first point of the measurement subject structure in step S432 thereamong, may apply the actually measured data to the physical model in step S433 thereamong, and may create virtual sensor information on a second point, to which a sensor device is not attached, in step S434 thereamong.

Accordingly, the present disclosure may design a physical model based on the experimental data of the actual measurement subject structure such that the finite element model and the actual measurement subject structure have the same structural vibration characteristics.

In addition, the present disclosure may predict an unmeasured point or unmeasured vibration information based on minimal measurement information.

FIG. 5 illustrates an operation method of a virtual sensing apparatus of structural vibration according to an embodiment of the present disclosure.

Referring to FIG. 5, in step S501 of the operation method of the virtual sensing apparatus of structural vibration, modal data of a measurement subject structure is acquired.

That is, the operation method of the virtual sensing apparatus of structural vibration according to an embodiment of the present disclosure may include performing a modal experiment on a measurement subject structure to acquire modal data.

In step S502 of the operation method of the virtual sensing apparatus of structural vibration, a finite element model for simulating structural vibration characteristics is updated.

That is, in step S501 of the operation method of the virtual sensing apparatus of structural vibration according to an embodiment of the present disclosure, the finite element model for simulating structural vibration characteristics of the measurement subject structure may be updated using the acquired modal data and a reduced modeling technique.

In step S503 of the operation method of the virtual sensing apparatus of structural vibration, actual displacement measurement data is measured from a first point.

That is, the operation method of the virtual sensing apparatus of structural vibration according to an embodiment of the present disclosure may include radiating laser to the first point of the measurement subject structure by the actual measurement data measurer, and then analyzing the returned laser to measure actual displacement measurement data.

In step S504 of the operation method of the virtual sensing apparatus of structural vibration, virtual sensor information of a second point is created.

That is, using the updated finite element model in step S502 of the operation method of the virtual sensing apparatus of structural vibration according to an embodiment of the present disclosure and using the actual displacement measurement data and a time integration algorithm in step S503 thereof, virtual displacement data at the second point of the measurement subject structure may be estimated, and virtual sensor information of the second point may be created based on the estimated virtual displacement data.

FIG. 6A illustrates a procedure of updating a finite element model by an operation method of a virtual sensing apparatus of structural vibration according to an embodiment of the present disclosure.

Referring to FIG. 6A, in step S601 of the operation method of the virtual sensing apparatus of structural vibration, a modal experiment on a measurement subject structure is performed.

In step S602 of the operation method of the virtual sensing apparatus of structural vibration, the shape, material-related data, eigenvalue, eigenvector, damping coefficient and frequency response of the measurement subject structure are collected. For example, the eigenvalue may include a natural frequency.

In step S603 of the operation method of the virtual sensing apparatus of structural vibration, a finite element model is created.

In step S604 of the operation method of the virtual sensing apparatus of structural vibration, modal updating of the finite element model is performed.

That is, the operation method of the virtual sensing apparatus of structural vibration includes performing modal updating to minimize an error between the natural frequency and the eigenvector of the finite element model.

For example, in the operation method of the virtual sensing apparatus of structural vibration, a specific variable change amount may be calculated using Mathematical Equation 2 below so as to minimize the natural frequency error:

$$\Delta \theta = \frac{\lambda_i^t - \lambda_i^a}{\varphi_i^T \left[ \frac{\partial K}{\partial \theta} - \lambda_i \frac{\partial M}{\partial \theta} \right] \varphi_i}$$ [Mathematical Equation 2]

In Mathematical Equation 2, θ may denote an arbitrary variable to be updated, $\lambda_i$ may denote a natural frequency, φ may denote an eigenvector, τ may denote a transpose matrix, t may denote a measured experimental value, a may denote a finite element model calculation value, i may denote an arbitrary order, K may denote a stiffness matrix, and M may denote a mass matrix.

In addition, the operation method of the virtual sensing apparatus of structural vibration may use an MAC value according to Mathematical Equation 3 below to quantify an error between the eigenvector and the eigenvector calculated by the finite element model:

$$MAC = \frac{|\varphi_i^t \cdot \overline{\varphi}_j^a|}{|\varphi_i^t||\overline{\varphi}_j^a|}$$ [Mathematical Equation 3]

In Mathematical Equation 3, φ may denote an eigenvector, t may denote a measured experimental value, a may denote a finite element model calculation value, and i and j may denote an arbitrary order.

In step S605 of the operation method of the virtual sensing apparatus of structural vibration, a reduced model is created.

That is, the operation method of the virtual sensing apparatus of structural vibration may include creating a reduced model to reduce the amount of computation for the finite element model.

For example, an original model of the finite element model may be assumed to be the same as Mathematical Equation 4, the transformation equation T may be defined by applying the Craig-Bampton (CB) technique to Mathematical Equation 4 to minimize the size of matrix as in Mathematical Equation 5, and a reduced model may be created by multiplying the transformation equation T by Mathematical Equation 5 which is an original matrix.

$$\begin{bmatrix} M_s & M_c \\ M_c & M_b \end{bmatrix} \begin{bmatrix} \ddot{u}_s \\ \ddot{u}_b \end{bmatrix} + \begin{bmatrix} K_s & K_c \\ K_c & K_b \end{bmatrix} \begin{bmatrix} u_s \\ u_b \end{bmatrix} = \begin{bmatrix} 0 \\ f_b \end{bmatrix}$$ [Mathematical Equation 4]

In Mathematical Equation 4, M may denote a mass matrix, K may denote a stiffness matrix, u may denote a displacement vector, f may denote a force vector, subscript s may denote internal DOFs, subscript b may denote boundary DOFs, and subscript c may denote coupling DOFs.

$$\begin{bmatrix} u_s \\ u_b \end{bmatrix} = \hat{T}\hat{u}, \hat{u} = \begin{bmatrix} q_d \\ u_b \end{bmatrix},$$ [Mathematical Equation 5]

$$\hat{T} = \begin{bmatrix} \Phi_d & -K_s^{-1}K_c \\ 0 & I \end{bmatrix}$$

In Mathematical Equation 5, u may denote a displacement vector, f may denote a force vector, K may denote a stiffness matrix, $\hat{T}$ may denote a transformation matrix, $q_d$ may denote a generalized coordinate vector, $\Phi_d$ and may denote a dominant mode, I may denote a unit matrix, subscript s may denote internal DOFs, subscript b may denote boundary DOFs, and subscript c may denote coupling DOFs.

In step S606 of the operation method of the virtual sensing apparatus of structural vibration, the damping coefficient may be updated.

That is, by the operation method of the virtual sensing apparatus of structural vibration, the damping coefficient in the modal region may be updated, and a damping coefficient in a higher order region that cannot be measured may be updated using a 1% damping coefficient.

Here, the operation method of the virtual sensing apparatus of structural vibration may verify a change in response characteristic after updating the damping coefficient using a Frequency Response Function (FRF) according to Mathematical Equation 6 below:

$$\alpha_{kl}(\omega) = \frac{u_k(\omega)}{F_l(\omega)} \cong \sum_{i=1}^{N_{eig}} \frac{(\varphi_i)_k (\varphi_i)_l}{\lambda_i^2 - \omega^2 + 2j\omega\lambda_i\xi_i}$$ [Mathematical Equation 6]

In Mathematical Equation 6, α may denote an FRF, ω may denote a load frequency applied to a structure, ξ may denote a damping coefficient, $\lambda_i$ may denote a natural frequency, φ may denote an eigenvector, subscript 1 may denote a load action point in a modal experiment, subscript k may denote a response measurement point, t and j may denote an arbitrary order, N may denote DOFs, and F may denote structure measurement displacement.

In step S607 of the operation method of the virtual sensing apparatus of structural vibration, an updated finite element model may be created.

That is, by the operation method of the virtual sensing apparatus of structural vibration, the reduced model reflecting the modal update, the damping coefficient and the frequency response may be created as a finally updated finite element model.

FIG. 6B illustrates creation of a reduced model in update of a finite element model according to an embodiment of the present disclosure.

FIG. 6B exemplifies a procedure of gradually reducing point data for calculating a finite element model for a measurement subject structure to an original 600, a first reduced version 610, and a finally reduced version 620 to create a reduced model by the operation method of the virtual sensing apparatus of structural vibration.

A considerable calculation time is required to calculate all point data of the original 600 by the operation method of the virtual sensing apparatus of structural vibration, but calculation can be completed in a short time by simplifying to the finally reduced version 620.

In particular, the operation method of the virtual sensing apparatus of structural vibration uses a time integration algorithm upon creation of virtual sensor information on the second point. Here, the amount of necessary computation may be reduced by using a reduced model such as the finally reduced version 620.

Accordingly, the present disclosure may reduce the amount of computation required upon application of the time integration algorithm using data measured at a specific point of an actual measurement subject structure through application of a finite element reduction modeling technique and using the finite element model.

FIG. 7 illustrates a procedure of creating virtual sensor information of an unmeasured point by an operation method of a virtual sensing apparatus of structural vibration according to an embodiment of the present disclosure.

Referring to FIG. 7, in step S701 of the operation method of the virtual sensing apparatus of structural vibration, actual displacement measurement data is measured using a sensor attached to a measurement subject structure.

In step S702 of the operation method of the virtual sensing apparatus of structural vibration, a first state is determined using the actual displacement measurement data measured in step S701.

Here, the first state may represent the state of a finite element model before application of a time integration algorithm.

In step S703 of the operation method of the virtual sensing apparatus of structural vibration, a time integration algorithm is applied.

That is, the operation method of the virtual sensing apparatus of structural vibration uses a time integration algorithm, a load estimation algorithm, and the like as methods of solving the finite element model in real time and obtaining response of an unmeasured point. As the time integration algorithm, the Newmark-β time integration algorithm or the Bathe time integration algorithm may be used.

In step 704 of the operation method of the virtual sensing apparatus of structural vibration, a second state is determined.

That is, the operation method of the virtual sensing apparatus of structural vibration determines the second state or the unmeasured point in consideration of change in time and change in position.

Displacement data related to the second state is calculated in step S705 of the operation method of the virtual sensing apparatus of structural vibration, and an applied load, an acceleration or a velocity is estimated in step S706 of the operation method of the virtual sensing apparatus of structural vibration.

Here, the operation method of the virtual sensing apparatus of structural vibration performs a Newmark-β time integration process to which the Newmark-β time integration algorithm is applied.

For example, the Newmark-β time integration process may include initial calculation and iterative calculation. The initial calculation may include an operation for setting a variable to an initial value and Mathematical Equations 7 and 8 below, and the iterative calculation may include Mathematical Equations 9, 10, 11 and 12 below:

$$a_0 = \frac{1}{\alpha \Delta t^2}, a_1 = \frac{\delta}{\alpha \Delta t},$$
$$a_2 = \frac{1}{\alpha \Delta t}, a_3 = \frac{1}{2a} - 1,$$
$$a_4 = \frac{\delta}{\alpha} - 1, a_5 = \frac{\Delta t}{2}\left(\frac{\delta}{\alpha} - 2\right),$$
$$a_6 = \Delta t(1 - \delta), a_7 = \delta \Delta t$$

[Mathematical Equation 7]

In Mathematical Equation 7, a may denote an integration coefficient, α may denote an integration coefficient, δ may denote an integration coefficient, and Δt may denote a time change.

For example, the operation method of the virtual sensing apparatus of structural vibration may calculate an integration coefficient based on Mathematical Equation 7.

$$\tilde{K} = K + a_0 M + a_1 C$$ [Mathematical Equation 8]

In Mathematical Equation 8, $\tilde{K}$ may denote stiffness, a may denote an integration coefficient, K may denote a stiffness matrix, M may denote a mass matrix, and C may denote a damping matrix.

That is, the operation method of the virtual sensing apparatus of structural vibration may calculate stiffness applied to the finite element model based on Mathematical Equation 8.

$$^{t+\Delta t}\tilde{r} = {}^{t+\Delta t}r + M(a_0{}^t u + a_2{}^t \dot{u} + a_3{}^t \ddot{u}) + C(a_1{}^t u + a_4{}^t \dot{u} + a_5{}^t \ddot{u})$$ [Mathematical Equation 9]

In Mathematical Equation 9, a may denote an integration coefficient, M may denote a mass matrix, C may denote a damping matrix, Δt may denote time change, r may denote a time integral force, and u may denote a displacement vector.

That is, the operation method of the virtual sensing apparatus of structural vibration may calculate a load applied to the finite element model based on Mathematical Equation 9.

$$^{t+\Delta t}u = [\tilde{K}^{-1}]^{t+\Delta t}\tilde{r}$$ [Mathematical Equation 10]

In Mathematical Equation 10, t may denote time, Δt may denote time change, r may denote a time integral force, u may denote a displacement vector, and $\tilde{K}$ may denote stiffness.

That is, the operation method of the virtual sensing apparatus of structural vibration may calculate displacement according to a time change applied to the finite element model based on Mathematical Equation 10.

$$^{t+\Delta t}\ddot{u}=a_0(^{t+\Delta t}u-^tu)-a_2{}^t\dot{u}-a_3{}^t\ddot{u} \quad \text{[Mathematical Equation 11]}$$

In Mathematical Equation 11, t may denote time, Δt may denote time change, u may denote a displacement vector, and a may denote an integration coefficient.

That is, the operation method of the virtual sensing apparatus of structural vibration may calculate an acceleration according to a time change applied to the finite element model based on Mathematical Equation 11.

$$^{t+\Delta t}\dot{u}=^t\dot{u}-a_6{}^t\ddot{u}-a_7{}^{t+\Delta t}\ddot{u} \quad \text{[Mathematical Equation 12]}$$

In Mathematical Equation 12, t may denote time, Δt may denote time change, u may denote a displacement vector, and a may denote an integration coefficient.

That is, the operation method of the virtual sensing apparatus of structural vibration may calculate a velocity according to time change applied to the finite element model based on Mathematical Equation 12.

In step S707 of the operation method of the virtual sensing apparatus of structural vibration, it is determined whether real-time estimation for an unmeasured point is completed. Step S708 proceeds when the real-time estimation is completed, and the process is returned to step S702 when the real-time estimation is not completed.

In step S708 of the operation method of the virtual sensing apparatus of structural vibration, virtual sensor information on an unmeasured point is created according to a calculation result using Mathematical Equations 7 to 12.

FIGS. 8A and 8B illustrate an experiment for checking the accuracy of a displacement amount estimated by a virtual sensing apparatus of structural vibration according to an embodiment of the present disclosure.

Referring to FIG. 8A, an experiment environment 800 of the virtual sensing apparatus of structural vibration includes a virtual sensing apparatus 810, a first sensor device 820, a second sensor device 830 and a measurement subject structure.

For example, the measurement subject structure may include a first point 840 and a second point 850.

For example, the experiment environment 800 of the virtual sensing apparatus of structural vibration compares an estimation displacement amount 812 of the second point 850 with an actual measurement displacement amount 832 thereof.

In accordance with an embodiment of the present disclosure, the virtual sensing apparatus 810 may be connected to the first sensor device 820 to acquire data actually measured from the first point 840 through the first sensor device 820, and may calculate the estimation displacement amount 812 of the second point 850 using the finite element model and the time integration algorithm.

For example, the second sensor device 830 may not be connected to the virtual sensing apparatus 810, and may be attached to the second point 850 to verify the accuracy of the estimation displacement amount 812, thereby acquiring the actually measured data to provide the actual measurement displacement amount 832 as data.

Referring to FIG. 8B, an estimation displacement amount 862 estimated by the virtual sensing apparatus of structural vibration is compared with an actual displacement amount 864 measured by a second sensor device.

Graph 860 shows that a difference between the estimation displacement amount 862 and the actual displacement amount 864 is not large, and the estimation accuracy of the estimation displacement amount 862 is high.

FIGS. 9A and 9B illustrate an experiment for checking the accuracy of a load estimated by a virtual sensing apparatus of structural vibration according to an embodiment of the present disclosure.

Referring to FIG. 9A, an experiment environment 900 of the virtual sensing apparatus of structural vibration includes a virtual sensing apparatus 910, a first sensor device 920, a load measurement device 930 and a measurement subject structure.

For example, a load may be applied to a first point 940 of the measurement subject structure.

For example, the experiment environment 900 of the virtual sensing apparatus of structural vibration compares an estimation load 912 of the first point 940 with an actual measurement load 932 thereof.

In accordance with an embodiment of the present disclosure, the virtual sensing apparatus 910 may be connected to the first sensor device 920 to acquire actually measured data from the first point through the first sensor device 920, and may calculate the estimation load 912 of the first point using the finite element model and the time integration algorithm.

For example, the load measurement device 930 may not be connected to the virtual sensing apparatus 910, and may be connected to the first point to verify the accuracy of the estimation load 912, thereby acquiring the actual measurement load 932 to provide the same as data.

Referring to FIG. 9b, an estimation load 952 estimated by the virtual sensing apparatus of structural vibration is compared with an actual measurement load 954 measured by the load measurement device.

Graph 950 shows that a difference between the estimation load 952 and the actual measurement load 954 is not large and the estimation accuracy of the estimation load 952 is high.

FIG. 10 illustrates a comparison result of frequency responses according to update of a damping coefficient by a virtual sensing apparatus of structural vibration according to an embodiment of the present disclosure.

Referring to FIG. 10, graph 1000 represents an update value 1010, an original value 1020, and an experimental value 1030.

That is, graph 1000 shows a difference between the original value 1020 wherein damping coefficients of all orders have been uniformly assigned to 1% and the updated value 1010 updated utilizing damping coefficients obtained in an experiment.

It can be confirmed that, by the damping coefficient update of the virtual sensing apparatus of structural vibration according to an embodiment of the present disclosure, FRAC values at a laser sensor measurement point based on an FRF exhibit high frequency response similarity of 0.99 or more in all of before update and after updating at 0.53, 0.83, and 0.69 each in first to third orders.

The present disclosure can reprocess data measured at a specific point of an actual measurement subject structure using a finite element model synchronized and updated based on experimental data of the actual measurement subject structure and a virtual sensing algorithm to estimate measurement data of an unmeasured point.

The present disclosure can minimize the number of sensors attached for actual measurement, thereby being capable of preventing change in structural properties due to the attached sensors and minimizing installation cost due to sensor attachment.

The present disclosure can predict an unmeasured point or unmeasured vibration information based on minimal measurement information.

The present disclosure can design a physical model based on experimental data of an actual measurement subject structure such that a finite element model and the actual measurement subject structure have the same structural vibration characteristics.

The present disclosure can reduce the amount of computation required upon application of a time integration algorithm using data measured at a specific point of an actual measurement subject structure through application of a finite element reduction modeling technique, and a finite element model.

The apparatus described above may be implemented as a hardware component, a software component, and/or a combination of hardware components and software components. For example, the apparatus and components described in the embodiments may be achieved using one or more general purpose or special purpose computers, such as, for example, a processor, a controller, an arithmetic logic unit (ALU), a digital signal processor, a microcomputer, a field programmable gate array (FPGA), a programmable logic unit (PLU), a microprocessor, or any other device capable of executing and responding to instructions. The processing device may execute an operating system (OS) and one or more software applications executing on the operating system. In addition, the processing device may access, store, manipulate, process, and create data in response to execution of the software. For ease of understanding, the processing apparatus may be described as being used singly, but those skilled in the art will recognize that the processing apparatus may include a plurality of processing elements and/or a plurality of types of processing elements. For example, the processing apparatus may include a plurality of processors or one processor and one controller. Other processing configurations, such as a parallel processor, are also possible.

The methods according to the embodiments of the present disclosure may be implemented in the form of a program command that can be executed through various computer means and recorded in a computer-readable medium. The computer-readable medium can store program commands, data files, data structures or combinations thereof. The program commands recorded in the medium may be specially designed and configured for the present disclosure or be known to those skilled in the field of computer software. Examples of a computer-readable recording medium include magnetic media such as hard disks, floppy disks and magnetic tapes, optical media such as CD-ROMs and DVDs, magneto-optical media such as floptical disks, or hardware devices such as ROMs, RAMs and flash memories, which are specially configured to store and execute program commands. Examples of the program commands include machine language code created by a compiler and high-level language code executable by a computer using an interpreter and the like. The hardware devices described above may be configured to operate as one or more software modules to perform the operations of the embodiments, and vice versa.

The software may include computer programs, code, instructions, or a combination of one or more of the foregoing, configure the processing apparatus to operate as desired, or command the processing apparatus, either independently or collectively. In order to be interpreted by a processing device or to provide instructions or data to a processing device, the software and/or data may be embodied permanently or temporarily in any type of a machine, a component, a physical device, a virtual device, a computer storage medium or device, or a transmission signal wave. The software may be distributed over a networked computer system and stored or executed in a distributed manner. The software and data may be stored in one or more computer-readable recording media.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

DESCRIPTION OF SYMBOLS

| | |
|---|---|
| 100: virtual sensing apparatus of structural vibration | |
| 110: experimental data acquisitor | 120: finite element model updater |
| 130: actual measurement data measurer | 140: virtual sensing information creator |

What is claimed is:

1. A virtual sensing apparatus of structural vibration, comprising:
    an experimental data acquisitor configured to perform a modal experiment on a measurement subject structure to acquire modal data;
    a finite element model updater configured to update a finite element model for simulating structural vibration characteristics of the measurement subject structure using the acquired modal data and a reduced modeling technique;
    an actual measurement data measurer configured to measure actual displacement measurement data from a first point of the measurement subject structure; and
    a virtual sensing information creator configured to estimate virtual displacement data at a second point of the measurement subject structure using the updated finite element model, the measured actual displacement measurement data and a time integration algorithm and create virtual sensor information of the second point based on the estimated virtual displacement data,
    wherein the virtual sensing information creator reflects the measured actual displacement measurement data in the updated finite element model, and then sets the measured actual displacement measurement data, as an initial value, based on the time integration algorithm to calculate a finite element model calculation value of the updated finite element model, and calculates change in any one of stiffness, load, displacement, velocity and acceleration, which are virtual displacement data at the second point, using the calculated finite element model calculation value.

2. The virtual sensing apparatus according to claim 1, wherein the experimental data acquisitor acquires the modal data comprising at least one of a natural frequency, an eigenvector, a damping coefficient and a frequency response, based on the performed modal experiment.

3. The virtual sensing apparatus according to claim 2, wherein the finite element model updater collects data related to mass, damping coefficient, stiffness matrix, displacement, shape and constituent materials of the measurement subject structure and constructs the finite element model based on the collected data.

4. The virtual sensing apparatus according to claim 1, wherein the virtual sensing information creator uses a Newmark-β time integration technique as the time integration algorithm, and calculates change in the load, the displacement, the velocity or the acceleration through iterative calculation after calculating change in the stiffness through initial calculation.

5. The virtual sensing apparatus according to claim 1, wherein the first point is a point which is located at the measurement subject structure and to which the actual measurement data measurer is attached, and the second point is a point which is located at the measurement subject structure and from which the actual displacement measurement data is not measured.

6. A virtual sensing apparatus of structural vibration, comprising:

an experimental data acquisitor configured to perform a modal experiment on a measurement subject structure to acquire modal data;

a finite element model updater configured to update a finite element model for simulating structural vibration characteristics of the measurement subject structure using the acquired modal data and a reduced modeling technique;

an actual measurement data measurer configured to measure actual displacement measurement data from a first point of the measurement subject structure; and a virtual sensing information creator configured to estimate virtual displacement data at a second point of the measurement subject structure using the updated finite element model, the measured actual displacement measurement data and a time integration algorithm and create virtual sensor information of the second point based on the estimated virtual displacement data, wherein the experimental data acquisitor acquires the modal data comprising at least one of a natural frequency, an eigenvector, a damping coefficient and a frequency response, based on the performed modal experiment, wherein the finite element model updater collects data related to mass, damping coefficient, stiffness matrix, displacement, shape and constituent materials of the measurement subject structure and constructs the finite element model based on the collected data, wherein the finite element model updater primarily updates the constructed finite element model using the natural frequency and the eigenvector, creates a reduced model for the primarily updated finite element model using the reduced modeling technique, and secondarily updates the reduced model using the damping coefficient and the frequency response to create the updated finite element model.

7. The virtual sensing apparatus according to claim 6, wherein, to minimize differences between the natural frequency and eigenvector of the finite element model and the natural frequency and eigenvector based on the performed modal experiment using the natural frequency and the eigenvector, the finite element model updater adopts a Modal Assurance Criterion (MAC) value to quantify the differences.

8. The virtual sensing apparatus according to claim 6, wherein the finite element model updater considers internal DOFs (Degrees Of Freedom), boundary DOFs and coupling DOFs of the primarily updated finite element model using the reduced modeling technique, and divides the considered internal DOFs into substrates to create the reduced model.

9. The virtual sensing apparatus according to claim 6, wherein the finite element model updater applies the damping coefficient to the created reduced model to calculate a Frequency Response Function (FRF), and quantifies similarity by comparing the frequency response with the frequency response based on the calculated FRF, thereby secondarily updating the reduced model to create the updated finite element model.

10. The virtual sensing apparatus according to claim 9, wherein the finite element model updater compares the frequency response with the calculated FRF-based frequency response using a Frequency Response Assurance Criterion (FRAC) value.

11. An operation method of a virtual sensing apparatus of structural vibration, the operation method comprising:

performing, by an experimental data acquisitor, a modal experiment on a measurement subject structure to acquire modal data;

updating, by a finite element model updater, a finite element model for simulating structural vibration characteristics of the measurement subject structure using the acquired modal data and a reduced modeling technique;

measuring, by an actual measurement data measurer, actual displacement measurement data from a first point of the measurement subject structure; and estimating, by a virtual sensing information creator, virtual displacement data at a second point of the measurement subject structure using the updated finite element model, the measured actual displacement measurement data and a time integration algorithm and creating virtual sensor information of the second point based on the estimated virtual displacement data, wherein the estimating and the creating comprises:

reflecting the measured actual displacement measurement data in the updated finite element model, and then setting the measured actual displacement measurement data, as an initial value, based on the time integration algorithm to calculate a finite element model calculation value of the updated finite element model; and calculating change in any one of stiffness, load, displacement, velocity and acceleration that are virtual displacement data at the second point using the calculated finite element model calculation value.

12. The operation method according to claim 11, wherein the performing comprises acquiring the modal data comprising at least one of a natural frequency, an eigenvector, a damping coefficient and a frequency response, based on the performed modal experiment.

13. The operation method according to claim 11, further comprising, by the finite element model updater, collecting data related to mass, damping coefficient, stiffness matrix, displacement, shape and constituent materials of the measurement subject structure and constructing the finite element model based on the collected data.

14. The operation method according to claim 13, wherein the updating comprises:

primarily updating the constructed finite element model using the natural frequency and the eigenvector;

creating a reduced model for the primarily updated finite element model using the reduced modeling technique; and secondarily updating the reduced model using the damping coefficient and the frequency response to create the updated finite element model.

15. The operation method according to claim 14, wherein the primarily updating comprises introducing a Modal Assurance Criterion (MAC) value to minimize differences between the natural frequency and eigenvector of the finite element model and the natural frequency and eigenvector based on the performed modal experiment using the natural frequency and the eigenvector, thereby quantifying the differences,
- the creating comprises considering internal DOFs (Degrees Of Freedom), boundary DOFs and coupling DOFs of the primarily updated finite element model using the reduced modeling technique, and dividing the considered internal DOFs into substrates to create the reduced model, and
- the secondarily updating comprises applying the damping coefficient to the created reduced model to calculate a Frequency Response Function (FRF); and quantifying similarity by comparing the frequency response with the frequency response based on the calculated FRF, thereby secondarily updating the reduced model to create the updated finite element model.

\* \* \* \* \*